(12) United States Patent
Lee et al.

(10) Patent No.: US 11,367,384 B2
(45) Date of Patent: Jun. 21, 2022

(54) DISPLAY DEVICE CAPABLE OF IMPROVING POWER CONSUMPTION AND METHOD FOR DRIVING THE SAME

(71) Applicant: Samsung Display Co., Ltd., Yongin-si (KR)

(72) Inventors: Gwang Teak Lee, Yongin-si (KR); Seong Sik Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/149,429

(22) Filed: Jan. 14, 2021

(65) Prior Publication Data

US 2021/0319744 A1    Oct. 14, 2021

(30) Foreign Application Priority Data

Apr. 14, 2020    (KR) .......................... 10-2020-0045270

(51) Int. Cl.
*G09G 3/32*     (2016.01)
*H01L 25/16*    (2006.01)
*H01L 33/20*    (2010.01)

(52) U.S. Cl.
CPC ....... *G09G 3/32* (2013.01); *G09G 2300/0809* (2013.01); *G09G 2310/08* (2013.01); *G09G 2320/0204* (2013.01); *G09G 2330/021* (2013.01); *G09G 2330/04* (2013.01); *H01L 25/167* (2013.01); *H01L 33/20* (2013.01)

(58) Field of Classification Search
None
See application file for complete search history.

(56) References Cited

U.S. PATENT DOCUMENTS

| 10,658,605 | B2 | 5/2020 | Lee et al. | |
|---|---|---|---|---|
| 2010/0177127 | A1* | 7/2010 | Akiyama | G09G 3/36 345/690 |
| 2012/0256897 | A1* | 10/2012 | Seo | G09G 3/006 345/212 |
| 2016/0189599 | A1* | 6/2016 | Lee | G09G 3/006 345/211 |
| 2018/0033373 | A1* | 2/2018 | Hong | G09G 3/325 |
| 2019/0081261 | A1* | 3/2019 | Lee | H01L 33/08 |
| 2021/0111323 | A1 | 4/2021 | Kim et al. | |

FOREIGN PATENT DOCUMENTS

| KR | 10-2017-0064163 A | 6/2017 |
|---|---|---|
| KR | 10-2018-0131002 A | 12/2018 |
| KR | 10-2019-0029831 A | 3/2019 |
| KR | 10-2021-0044938 A | 4/2021 |

* cited by examiner

*Primary Examiner* — Chad M Dicke
(74) *Attorney, Agent, or Firm* — Lewis Roca Rothgerber Christie LLP

(57) ABSTRACT

A display device and a driving method thereof are disclosed. The display device includes a subpixel including a light emitting unit including a first electrode, a second electrode, and a plurality of light emitting elements connected between the first electrode and the second electrode, and a driving transistor configured to supply a driving current to the light emitting unit; a detector electrically connected to the light emitting unit to detect a short circuit in the plurality of light emitting elements; and a blocking controller configured to control blocking of the driving current based on an output of the detector. Accordingly, power consumption of the display device may be improved.

13 Claims, 12 Drawing Sheets

DISPLAY DEVICE CAPABLE OF IMPROVING POWER CONSUMPTION AND METHOD FOR DRIVING THE SAME

CROSS-REFERENCE TO RELATED APPLICATION

This application claims priority to and the benefit of Korean Patent Application No. 10-2020-0045270, filed on Apr. 14, 2020, the disclosure of which is incorporated by reference herein in its entirety.

BACKGROUND

1. Field

The present disclosure relates to a display device and a driving method thereof, and more particularly, to a display device capable of emitting light by using ultra-small light emitting elements having a nano-scale or micro-scale size, and a driving method thereof.

2. Discussion of the Related Art

As information technology has developed, the importance of a display device, which may be a connection medium between a user and information, has been highlighted. Accordingly, the use of display devices, such as, a liquid crystal display device, an organic light emitting display device, and a plasma display device has been increasing.

The organic light emitting display device emits light by using an organic light emitting diode (OLED). Because the organic light emitting diode is formed using an organic material, the organic light emitting diode may be deteriorated or a light emitting efficiency may be reduced over time or as a driving time-period is accumulated.

Recently, research has been conducted by using an inorganic material in a light emitting element in order to solve the above-described problem of the organic light emitting diode. For example, research on a display device that has a nano-scale or micro-scale size and emits light by using an ultra-small light emitting element formed of an inorganic material has been continuously conducted.

The above information disclosed in this Background section is only for enhancement of understanding of the background of the disclosure, and therefore it may contain information that does not form prior art.

SUMMARY

One or more aspects of the present disclosure are to provide a display device capable of improving power consumption by blocking a driving current of a subpixel that may be viewed as a so-called dark spot from the outside.

One or more aspects of the present disclosure are to provide a driving method of the display device.

One or more aspects of the present disclosure is not limited to the above-described aspects, and may be variously extended without departing from the spirit and scope of the present disclosure.

According to one or more aspects of the present disclosure, a display device is provided.

According to one or more example embodiments, a display device may include: a subpixel including a light emitting unit including a first electrode, a second electrode, and a plurality of light emitting elements connected between the first electrode and the second electrode, and a driving transistor configured to supply a driving current to the light emitting unit; a detector electrically connected to the light emitting unit to detect a short circuit in the plurality of light emitting elements; and a blocking controller configured to control blocking of the driving current based on an output of the detector.

In one or more example embodiments, each of the plurality of light emitting elements include an inorganic light emitting diode having a nano-scale or micro-scale size.

In one or more example embodiments, the light emitting unit may include a plurality of groups, each of the plurality of groups including a plurality of light emitting elements connected in parallel to each other, and the plurality of groups may be connected to each other in series between the first electrode and the second electrode.

In one or more example embodiments, the detector includes at least one comparator configured to compare a reference voltage with a voltage at the first electrode or at least one of the nodes connecting the plurality of groups in series.

In one or more example embodiments, the at least one comparator may include a main comparator electrically connected to the first electrode to compare a voltage of the first electrode with a first reference voltage.

In one or more example embodiments, the first reference voltage may be determined by using a value corresponding to a number of the plurality of groups.

In one or more example embodiments, the first reference voltage may be determined by multiplying the number of the groups by a set ratio (e.g., a predetermined ratio).

In one or more example embodiments, the main comparator may include an amplifier having a first input terminal to receive the voltage of the first electrode, a second input terminal to receive the first reference voltage, and an output terminal to output a result of a comparison of the voltage of the first electrode with the first reference voltage as one of a low level signal and a high level signal.

In one or more example embodiments, the blocking controller may output a cutoff signal to block the driving current through a blocking control line when the voltage of the first electrode is less than the first reference voltage based on an output of the main comparator.

In one or more example embodiments, the subpixel may further include a blocking transistor that is configured to turn off in response to the cutoff signal.

In one or more example embodiments, the blocking transistor may be electrically connected to a gate electrode of the driving transistor to turn off the driving transistor in response to the cutoff signal.

In one or more example embodiments, the blocking transistor may be located in a path of the driving current flowing from a first power supply to a second power supply via the driving transistor.

In one or more example embodiments, the at least one comparator may further include auxiliary comparators that are electrically connected to respective nodes to compare voltages of the respective nodes with a second reference voltage.

In one or more example embodiments, the blocking controller may output a cutoff signal to block the driving current through a blocking control line based on outputs of the main comparator and the auxiliary comparators.

In one or more example embodiments, the blocking controller may be configured to output the cutoff signal by logically OR-operating the outputs of the main comparator and the auxiliary comparators.

One or more example embodiments of the present disclosure provide a driving method of a display device.

In one or more example embodiments, the driving method of the display device may include: sensing at least one voltage of a light emitting unit including a first electrode, a second electrode, and a plurality of light emitting elements connected between the first electrode and the second electrode; comparing at least one sensed voltage with a reference voltage; and generating a cutoff signal to block a driving current supplied to the light emitting unit in response to a result of the comparison.

In one or more example embodiments, each of the light emitting elements may be an inorganic light emitting diode having a nano-scale or micro-scale size.

In one or more example embodiments, the light emitting unit may include a plurality of groups, each of the plurality of groups including a plurality of light emitting elements connected in parallel to each other, and the plurality of groups may be connected to each other in series between the first electrode and the second electrode.

In one or more example embodiments, the comparing may include comparing a voltage of the first electrode with a first reference voltage.

In one or more example embodiments, the comparing may further include comparing voltages of nodes connecting the groups in series with a second reference voltage.

In accordance with a display device and a driving method thereof according to the present disclosure, it is possible to improve power consumption by detecting a short circuit occurring between a plurality of light emitting elements included in a light emitting unit of a subpixel, and blocking a driving current of the subpixel depending on whether the short circuit is detected or a ratio of the light emitting elements that are short-circuited.

DETAILED DESCRIPTION

Figure 1:
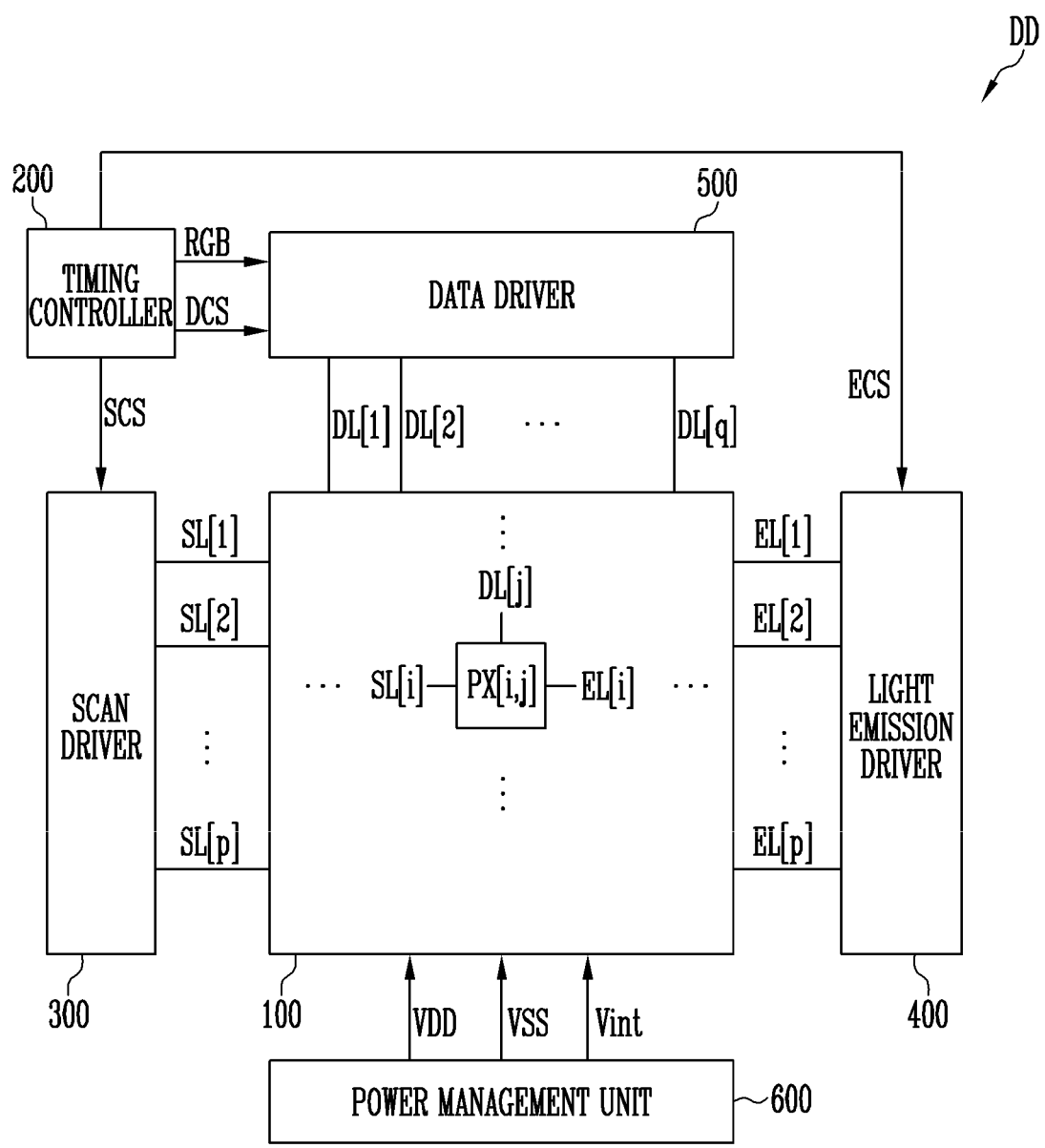
FIG. 1 illustrates schematic diagram showing a display device according to one or more example embodiments of the present disclosure.

The present disclosure will be described more fully hereinafter with reference to the accompanying drawings, in which example embodiments of the disclosure are shown.

As those skilled in the art would realize, the described embodiments may be modified in various different ways, all without departing from the spirit or scope of the present disclosure.

To clearly describe the present disclosure, parts that are irrelevant to the description are omitted, and like numerals refer to like or similar constituent elements throughout the specification. Therefore, the reference numerals described above may be used in other drawings.

Further, because sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In one or more example embodiments, it will also be understood that when a layer is referred to as being "between" two layers, it can be the only layer between the two layers, or one or more example intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

FIG. 1 illustrates schematic diagram showing a display device according to one or more example embodiments of the present disclosure.

Referring to FIG. 1, the display device DD may include a display panel 100, a timing controller 200, a scan driver 300, a light emission driver 400, a data driver 500, and a power management unit 600.

The display panel 100 may include a plurality of pixels PX [i, j]. The pixels PX[i, j] may include p rows (p being a natural number) and q columns (q being a natural number). The pixels PX [i, j] located in a same row (hereinafter, may also be referred to as horizontal lines) may be connected to a same scan line and a same light emission line. In one or more example embodiments, the pixels PX[i, j] located in a same column (hereinafter, may also be referred to as vertical lines) may be connected to a same data line. For example, the pixel PX[i, j] located in an $i^{th}$ row (i being a natural number less than or equal to p) and a $j^{th}$ column (j being a natural number less than or equal to q) may be connected to an $i^{th}$ scan line SL[i] and an $i^{th}$ light emission line EL[i], and may be connected to a $j^{th}$ data line DL[j].

The timing controller 200 may generate a scan driving control signal SCS, a data driving control signal DCS, and an emission control signal ECS in response to synchronization signals supplied from the outside. The scan driving control signal SCS may be supplied to the scan driver 300, the data driving control signal DCS may be supplied to the data driver 500, and the emission control signal ECS may be supplied to the light emission driver 400. In one or more example embodiments, the timing controller 200 may generate image data RGB based on input image data supplied from the outside, and may supply the generated image data RGB to the data driver 500.

The scan drive control signal SCS may include a scan start signal and clock signals. The scan start signal may be a signal for controlling a first timing of scan signals. The clock signals may be used to shift the scan start signal.

The emission control signal ECS may include an emission start signal and clock signals. The emission start signal may control a first timing of an emission signal. The clock signals may be used to shift the emission start signal.

The data control signal DCS may include a source start pulse and clock signals. The source start pulse may control a starting point of data sampling. The clock signals may be used to control a sampling operation.

The scan driver 300 may receive the scan driving control signal SCS from the timing controller 200, and may sequentially supply scan signals to the scan lines SL[1], SL[2], . . . , and SL[p] based on the scan driving control signal SCS. When the scan signals are sequentially supplied, the pixels PX [i, j] are selected in units of horizontal lines (or pixel rows), and data signals may be supplied to the selected pixels PX [i, j].

The scan driver 300 may include scan stages configured in a form of shift registers. The scan driver 300 may generate a scan signal by sequentially transmitting a scan start signal in a form of a pulse of a turn-on level to a next scan stage under the control of the clock signal.

The light emission driver 400 may receive the emission control signal ECS from the timing controller 200, and may sequentially supply emission signals to the emission control lines EL [1], EL [2], . . . , and EL [p] based on the emission control signal ECS. The emission signals may be used to control an emission time of pixels PX [i, j]. For this purpose, the emission signals may be set to have a wider bandwidth than that of the scan signals.

The data driver 500 may receive the data driving control signal DCS and image data RGB from the timing controller 200. The data driver 500 may supply data voltages (or data signals) to the pixels PX [i, j] located on the horizontal lines, selected by the scan signals, through the data lines DL[1], DL[2], . . . , and DL[q] based on the image data RGB. For this purpose, the data driver 500 may supply the data voltages to the data lines DL[1], DL[2], . . . , and DL[q] to be synchronized with the scan signals.

The power management unit 600 may supply a voltage of a first power supply VDD, a voltage of the second power supply VSS, and a voltage of an initialization power supply Vint to the display panel 100. The first power supply VDD and the second power supply VSS may generate voltages for driving a plurality of light emitting elements included in each pixel PX [i, j] (or included in subpixels) of the display panel 100. In one or more example embodiments, the voltage of the second power supply VSS may be lower than that of the first power supply VDD. For example, the voltage of the first power supply VDD may be a positive voltage, and the voltage of the second power supply VSS may be a negative voltage. The driving transistor and/or the light emitting element included in the pixel PX [i, j] may be initialized by the voltage of the initialization power supply Vint.

While the light emission driver 400 for supplying an emission signal is illustrated in FIG. 1, the light emission driver 400 may be omitted depending on a circuit structure of subpixels SPX1, SPX2, and SPX3 to be described later, or a second scan driver, which is similar to the scan driver 300 and outputs a second scan signal, may be added.

Figure 2:
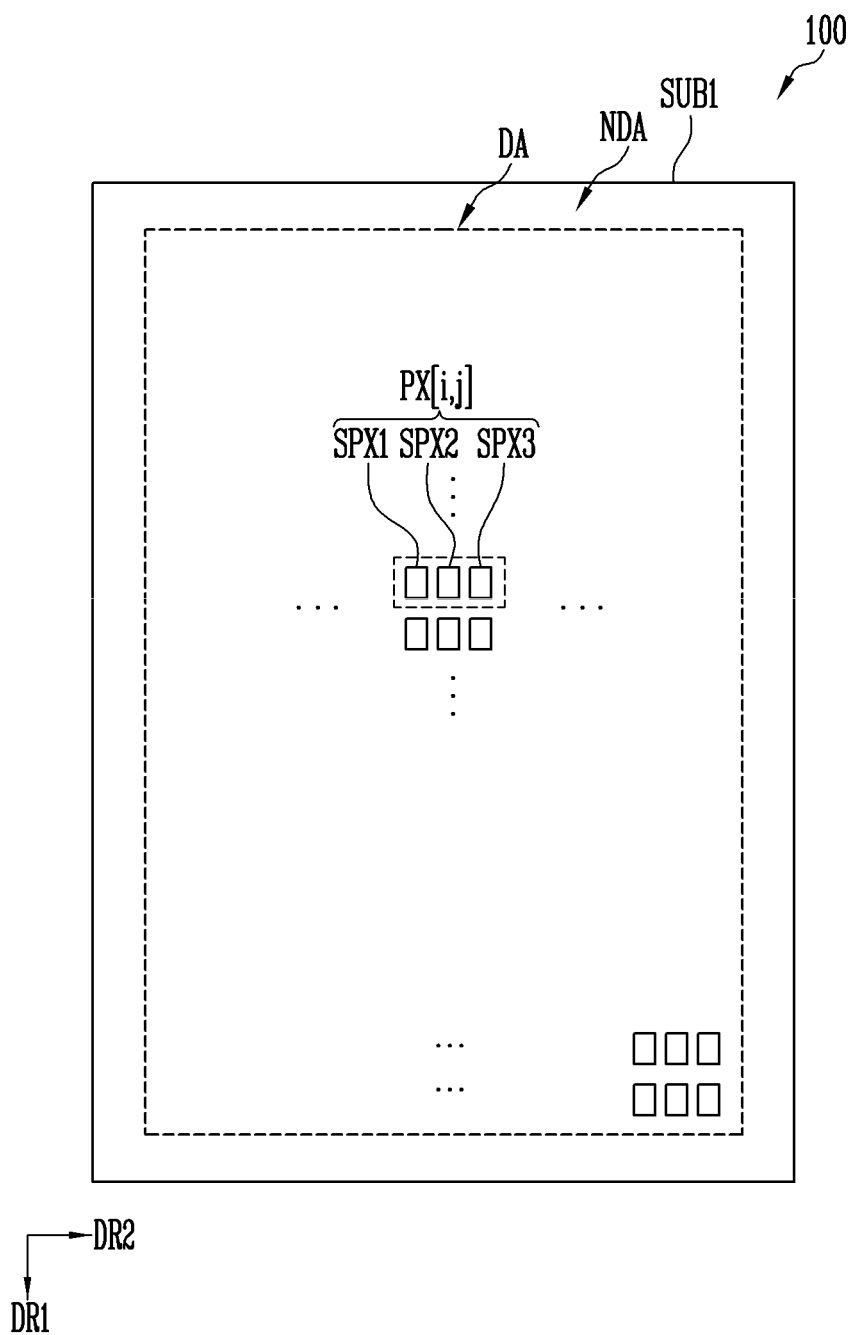
FIG. 2 illustrates a top plan view of a display panel according to FIG. 1.

FIG. 2 illustrates a top plan view of a display panel according to FIG. 1.

Referring to FIG. 2, the display panel 100 may include a base layer SUB1 (or a substrate) and pixels PX [i, j] located on the base layer SUB1. In one or more example embodiments, the display panel 100 and the base layer SUB1 may include a display area DA in which an image is displayed and a non-display area NDA excluding the display area DA.

According to one or more example embodiments, the display area DA may be positioned in a central area of the display panel 100, and the non-display area NDA may be positioned along an edge (e.g., a periphery) of the display panel 100 to surround the display area DA. However, positions of the display area DA and the non-display area NDA are not limited thereto, and their positions may be changed.

The base layer SUB1 may constitute a base member of the display panel 100. For example, the base layer SUB1 may constitute a base member of a lower panel (e.g., a lower panel of the display panel 100).

According to one or more example embodiments, the base layer SUB1 may be a rigid substrate or a flexible substrate. For example, the base layer SUB1 may be a rigid substrate made of glass or tempered glass, or a flexible substrate made of a thin film made of plastic or a metal. In one or more example embodiments, the base layer SUB1 may be a transparent substrate, a translucent substrate, an opaque substrate, or a reflective substrate.

The base layer SUB1 may include a display area DA in which the pixels PX [i, j] are located, and a non-display area NDA corresponding to a remaining area that is other than the display area DA. The non-display area NDA may be positioned on at least one side of the display area DA. Various wires and/or built-in circuit units connected to the pixels PXL of the display area DA may be positioned in the non-display area NDA.

The pixel PX [i, j] may include a plurality of subpixels. For example, the pixel PX [i, j] may include a first subpixel SPX1, a second subpixel SPX2, and a third subpixel SPX3. According to one or more example embodiments, the first, second and third subpixels SPX1, SPX2, and SPX3 may emit light in different colors. For example, the first subpixel SPX1 may be a red subpixel that emits red light, the second subpixel SPX2 may be a green subpixel that emits green light, and the third subpixel SPX3 may be a blue subpixel that emit blue light.

In one or more example embodiments, each of the subpixels SPX1, SPX2, and SPX3 may emit light by using a light emitting unit LSU, and the light emitting unit LSU may include a plurality of light emitting elements LD. For example, each of the light emitting elements LD has a size as small as nano-scale to micro-scale, and may be a light emitting diode (for example, an inorganic light emitting diode), and the light emitting elements LD may be connected in series and/or in parallel with each other.

Hereinafter, the first subpixel SPX1, the second subpixel SPX2, and the third subpixel SPX3 may be collectively referred to as a subpixel SPX.

Figure 3:
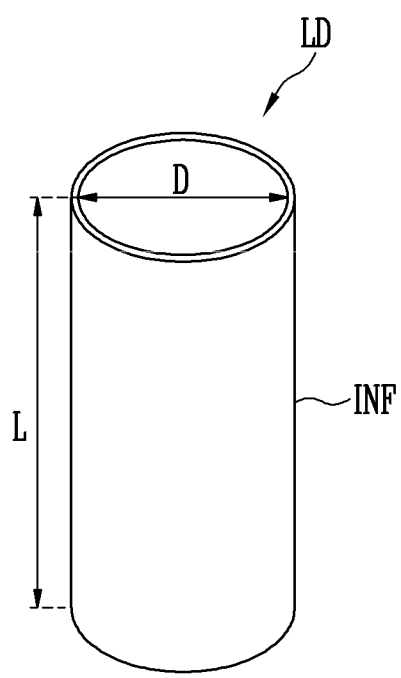
FIG. 3 and FIG. 4 respectively illustrate a perspective view and a cross-sectional view showing a light emitting element according to one or more example embodiments of the present disclosure.
Figure 4:
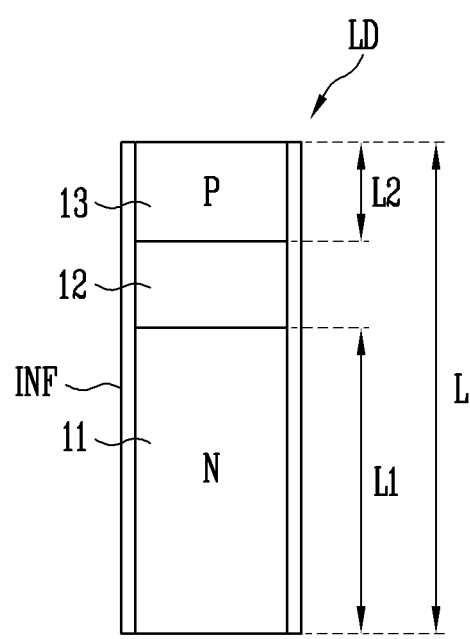

FIG. 3 and FIG. 4 respectively illustrate a perspective view and a cross-sectional view showing a light emitting element according to one or more example embodiments of the present disclosure.

Referring to FIG. 3 and FIG. 4, the light emitting element LD may include a first semiconductor layer 11, a second semiconductor layer 13, and an active layer 12 located between the first and second semiconductor layers 11 and 13. For example, the light emitting element LD may be formed as a stack in which the first semiconductor layer 11, the active layer 12, and the second semiconductor layer 13 are sequentially stacked along a direction.

According to one or more example embodiments, the light emitting element LD may have a stick shape extending along a direction. The light emitting element LD may have a first end portion and a second end portion along a direction.

According to one or more example embodiments, one of the first and second semiconductor layers 11 and 13 may be located at the first end portion of the light emitting element LD, and the other one of the first and second semiconductor layers 11 and 13 may be located at the second end portion of the light emitting element LD.

According to one or more example embodiments, the light emitting element LD may be a light emitting diode (LED) manufactured to have a stick shape. In one or more example embodiments, the stick shape includes a rod-like shape or a bar-like shape that is longer in a longitudinal direction than a width direction (i.e., an aspect ratio thereof being greater than 1), such as a cylinder or a polygonal column, and the like, and the shape of a cross section thereof is not particularly limited. For example, a length L of the light emitting element LD may be greater than a diameter D thereof (or the width of the cross section).

According to one or more example embodiments, the light emitting element LD may have a size as small as a nanometer scale to a micrometer scale, e.g., a diameter D and/or a length L ranging from about 100 nm to about 10 μm. However, the size of the light emitting element LD may be variously changed depending on design conditions of the display device DD by using the light emitting element LD.

The first semiconductor layer 11 may include at least one n-type semiconductor material. For example, the first semiconductor layer 11 includes a semiconductor material from among InAlGaN, GaN, AlGaN, InGaN, AlN, and InN, and may include an n-type semiconductor material doped with a first conductive dopant such as Si, Ge, Sn, etc.

The active layer 12 is located on the first semiconductor layer 11, and may be formed in a single or multiple quantum well structure. In one or more example embodiments, a clad layer doped with a conductive dopant may be formed at an upper portion and/or a lower portion of the active layer 12. For example, the clad layer may be formed as an AlGaN layer or an InAlGaN layer. According to one or more example embodiments, a material such as AlGaN or AlInGaN may be used to form the active layer 12, and various other materials may constitute the active layer 12. For example, the active layer 12 may be located between the first semiconductor layer 11 and the second semiconductor layer 13 described below.

When a voltage that is equal to or greater than a threshold voltage is applied to opposite ends of the light emitting element LD, the light emitting element LD may emit light while electron-hole pairs are coupled in the active layer 12. The light emitting element LD may be used as a light supply for various light emitting elements including pixels of a display device by controlling light emission of the light emitting element LD using this principle.

The second semiconductor layer 13 is located on the active layer 12, and may include a semiconductor material of a type different from that of the first semiconductor layer 11. For example, the second semiconductor layer 13 may include at least one p-type semiconductor material. For example, the second semiconductor layer 13 includes at least one semiconductor material from among InAlGaN, GaN, AlGaN, InGaN, AlN, and InN, and may include a p-type semiconductor material doped with a second conductive dopant such as Mg.

According to one or more example embodiments, a first length L1 of the first semiconductor layer 11 may be longer than a second length L2 of the second semiconductor layer 13.

According to one or more example embodiments, the light emitting element LD may further include an insulating coating INF provided on a surface thereof. An insulating film INF may be located on the surface of the light emitting element LD to surround at least an outer peripheral surface (e.g., an outer circumferential surface) of the active layer 12, and may be located to further surround a region of the first and second semiconductor layers 11 and 13.

According to one or more example embodiments, the insulating film INF may expose opposite end portions of the light emitting element LD having different polarities. For example, the insulating film INF may expose one end of each of the first and second semiconductor layers 11 and 13 located at opposite ends of the light emitting element LD in a longitudinal direction, e.g., two surfaces (i.e., upper and bottom surfaces) of a cylinder instead of covering them. In some other example embodiments, the insulating coating INF may expose opposite end portions of light emitting element LD having different polarities and side portions of semiconductor layers 11 and 13 which are adjacent to the opposite ends thereof.

According to one or more example embodiments, the insulating film INF may include at least one insulating material from among a silicon dioxide ($SiO_2$), a silicon nitride ($Si_3N_4$), an aluminum oxide ($Al_2O_3$), and a titanium dioxide ($TiO_2$).

In one or more example embodiments, the light emitting element LD may further include additional components in addition to the first semiconductor layer 11, the active layer 12, the second semiconductor layer 13 and/or the insulating film INF. For example, the light emitting element LD may include one or more phosphor layers, active layers, semiconductor material layers, and/or electrode layers located at first ends of the first semiconductor layer 11, the active layer 12, and/or the second semiconductor layer 13.

When a voltage that is equal to or greater than a threshold voltage is applied to opposite ends of the light emitting element LD, the light emitting element LD may emit light while electron-hole pairs are coupled in the active layer 12.

Figure 5A:
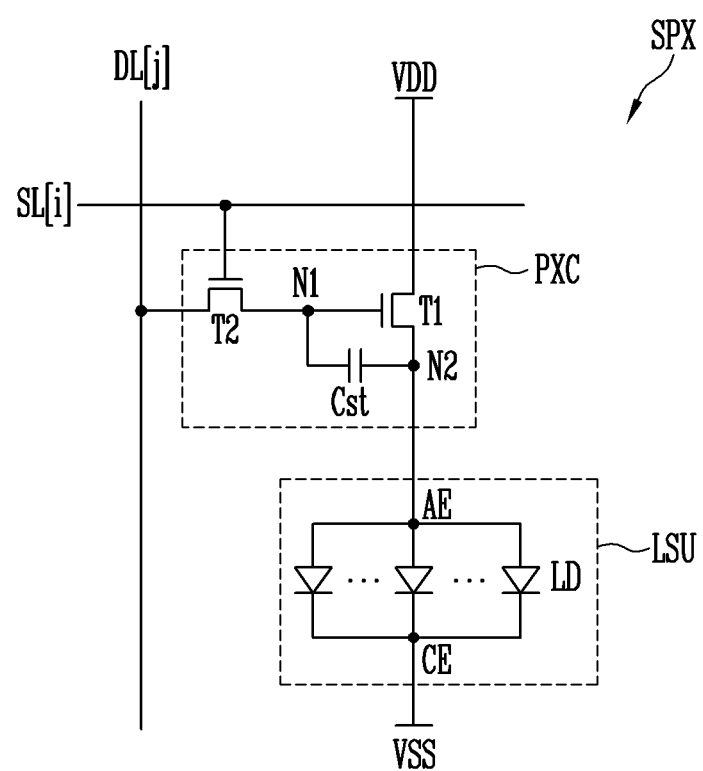
FIG. 5A-FIG. 5C illustrate circuit diagrams showing an example of a subpixel according to FIG. 2.
Figure 5B:
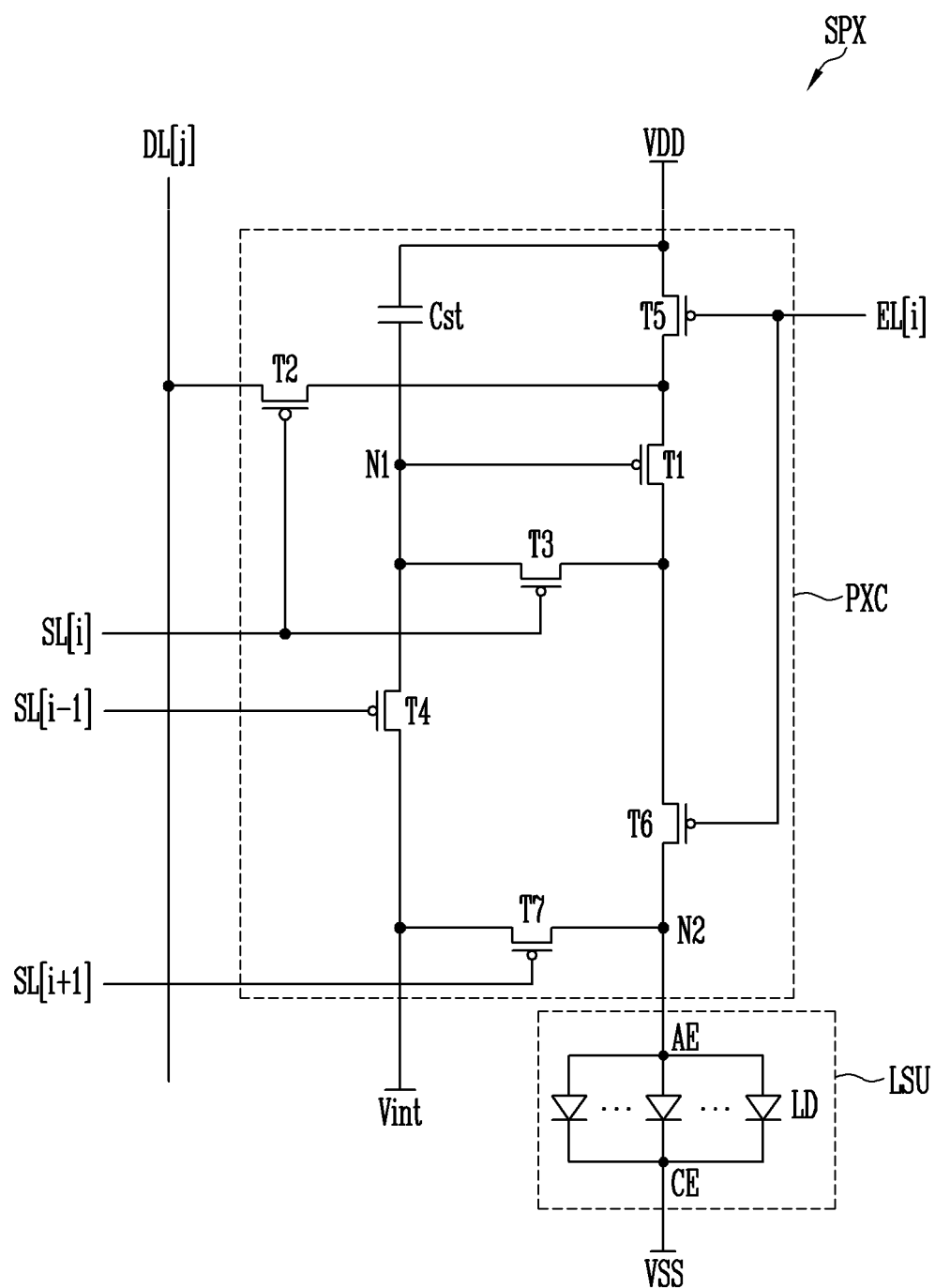
Figure 5C:
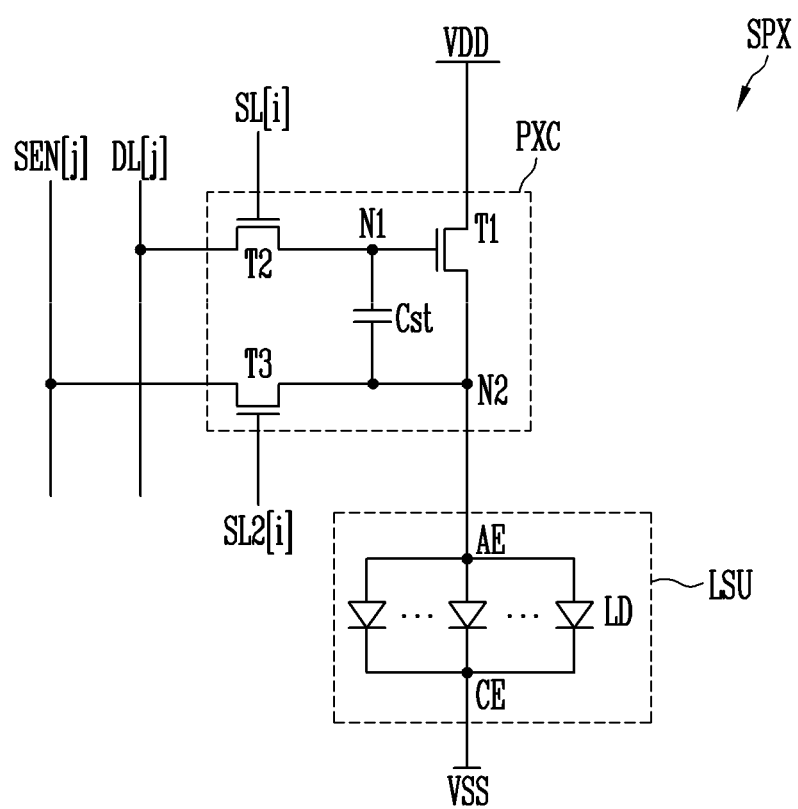

FIG. 5A-FIG. 5C illustrate circuit diagrams showing an example of a subpixel according to FIG. 2.

FIG. 5A-FIG. 5C illustrate one or more example embodiments of a circuit diagram of a subpixel SPX, and the first subpixel SPX1, the second subpixel SPX2, and the third subpixel SPX3 may be implemented to have a same form as the subpixel SPX according to FIG. 5A-FIG. 5C.

In FIG. 5A-FIG. 5C, the light emitting element LD may be an inorganic light emitting diode having a nanoscale or microscale size described with reference to FIG. 3-FIG. 4.

Hereinafter, on the premise that the subpixel SPX is located in a $i^{th}$ row and a $j^{th}$ column of the display area DA, the data line DL[j] connected to the subpixel SPX may be a $j^{th}$ data line DL[j], the scan line SL[i] connected to the subpixel SPX may a $i^{th}$ scan line SL[i], and the emission control line EL[i] connected to the subpixel SPX may be a $i^{th}$ emission control line EL[i].

Referring to FIG. 5A-FIG. 5C, the subpixel SPX may include a light emitting unit LSU including a first electrode AE, a second electrode CE, and a plurality of light emitting elements LD connected between the first electrode AE and the second electrode CE, and a driving transistor for supplying a driving current to the light emitting unit LSU. Hereinafter, the driving transistor may be alternatively referred to as a first transistor T1.

The light emitting unit LSU may include the first electrode AE electrically connected to the first power supply VDD and the second electrode CE electrically connected to the second power supply VSS. The light emitting unit LSU may emit light with luminance corresponding to the driving current by using the light emitting elements LD. Accordingly, an image may be displayed in the display area DA of the display panel 100.

The first transistor T1 (e.g., a driving transistor) may be electrically connected between the first power supply VDD and the second power supply VSS to generate a driving current corresponding to the data signal (or data voltage) and to supply the generated driving current to the light emitting unit LSU.

Referring to FIG. 5A according to one or more example embodiments, the subpixel SPX may include a first transistor T1, a second transistor T2, a storage capacitor Cst, and a light emitting unit LSU.

In one or more example embodiments, the first transistor T1 (e.g., the driving transistor) may include a gate electrode connected between the first power supply VDD and the first electrode AE of the light emitting unit LSU and connected to a first node N1. For example, the first transistor T1 may be connected between the first power supply VDD and the first electrode AE of the light emitting unit LSU and a gate electrode of the first transistor T1 may be connected to a first node N1. The first transistor T1 may be turned on in response to a voltage applied to the first node N1, thereby generating a driving current.

The second transistor T2 may include a gate electrode connected between the data line DL[j] and the first node N1 and connected to the scan line SL[i]. For example, the second transistor T2 may be connected between the data line DL[j] and the first node N1 and a gate electrode of the second transistor may be connected to the scan line SL[i]. The second transistor T2 may be turned on in response to a scan signal supplied through the scan line SL[i] to transfer a data signal supplied through the data line DL[j] to the first node N1. The second transistor T2 may also be referred to as a switching transistor.

The storage capacitor Cst may be connected between the first node N1 and a second node N2. Accordingly, the storage capacitor Cst may store a voltage applied between the first node N1 and the second node N2. In FIG. 5A, the second node N2 may be the same node as a second electrode of the first transistor T1.

The light emitting unit LSU may be connected between the second node N2 and the second power supply VSS. In one or more example embodiments, the light emitting unit LSU may be connected between the first power supply VDD and the first electrode of the first transistor T1, unlike what is illustrated in FIG. 5A.

Referring to FIG. 5B according to one or more example embodiments, the subpixel SPX may include first to seventh transistors T1 to T7, a storage capacitor Cst, and a light emitting unit LSU.

The first transistor T1 may be connected between the first power supply VDD and the light emitting unit LSU. For example, a first electrode (e.g., source electrode) of the first transistor T1 may be connected to the first power supply VDD through the fifth transistor T5, and a second electrode (e.g., drain electrode) of the first transistor T1 may be connected to the first electrode AE of the light emitting unit LSU through the sixth transistor T6. A gate electrode of the first transistor T1 may be connected to the first node N1. The first transistor T1 may be turned on in response to a voltage applied to the first node N1 to supply a driving current to the light emitting unit LSU.

The second transistor T2 may be connected between the data line DL[j] and the first electrode of the first transistor T1. A gate electrode of the second transistor T2 may be connected to the scan line SL[i]. When a scan signal of a gate-on voltage (e.g., a low voltage level) is supplied from the scan line SL[i], the second transistor T2 may be turned on to transfer a data signal supplied through the data line DL[j] to the first electrode of the first transistor T1.

The third transistor T3 may be connected between the second electrode (e.g., drain electrode) of the first transistor T1 and the first node N1. The third transistor T3 may include a gate electrode connected to the scan line SL[i]. When the scan signal of the gate-on voltage (e.g., a low voltage level) is supplied from the scan line SL[i], the third transistor T3 may be turned on to electrically connect the gate electrode of the first transistor T1 (e.g., the first node N1) and the second electrode of the first transistor T1, and to operate the first transistor T1 in a diode form (e.g., the first transistor T1 is diode connected).

The fourth transistor T4 may be connected between the first node N1 and the initialization power supply Vint. A gate electrode of the fourth transistor T4 may be connected to a previous scan line SL[i−1]. When the scan signal of the gate-on voltage (e.g., a low voltage level) is supplied to the previous scan line SL[i−1], the fourth transistor T4 may be turned on to transfer a voltage of the initialization power supply Vint to the first node N1. Herein, the voltage of the initialization power supply Vint may be less than or equal to a lowest voltage of the data signal.

The fifth transistor T5 may be connected between the first power supply VDD and the first electrode of the first transistor T1. The fifth transistor T5 may include a gate electrode connected to the emission control line EL[i]. When an emission control signal of a gate-on voltage (e.g., low level voltage) is supplied to the emission control line EL[i], the fifth transistor T5 may be turned on to apply the voltage of the first power supply VDD to the first electrode of the first transistor T1.

The sixth transistor T6 may be connected between the first transistor T1 and the first electrode AE of the light emitting unit LSU. The sixth transistor T6 may include a gate electrode connected to the emission control line EL[i]. When the light emission control signal of the gate-on voltage (e.g., a low voltage level) is supplied through the light emission control line EL[i], the sixth transistor T6 may be turned on to transfer the driving current of the first transistor T1 to the light emitting unit LSU.

The seventh transistor T7 may be connected between the first electrode AE (or the second node N2) of the light emitting unit LSU and the initialization power supply Vint. The seventh transistor T7 may include a gate electrode connected to a subsequent scan line SL[i+1]. When the scan signal of the gate-on voltage (e.g., a low voltage level) is supplied to the subsequent scan line SL[i+1], the seventh transistor T7 may be turned on to transfer the voltage of the initialization power supply Vint to the first electrode AE of the light emitting unit LSU. Accordingly, when the scan signal of the gate-on voltage (e.g., a low voltage level) is supplied to the scan line SL[i+1], the first electrode AE of the light emitting unit LSU may be initialized to the voltage of the initialization power supply Vint. In one or more example embodiments, the gate electrode of the seventh transistor T7 may be connected to the $i^{th}$ scan line SL[i], and when the scan signal is supplied to the scan line SL[i], the seventh transistor T7 may be turned on to apply the voltage of the initialization power supply Vint to the first electrode AE of the light emitting unit LSU.

The storage capacitor Cst may be connected between the first power supply VDD and the first node N1. The storage capacitor Cst may store a data signal supplied to the first node N1 and a voltage corresponding to a threshold voltage of the first transistor T1 during each frame period.

The light emitting unit LSU may be connected between the second node N2 and the second power supply VSS.

Referring to FIG. 5C according to one or more example embodiments, the subpixel SPX may include first to third transistors T1, T2, and T3, a storage capacitor Cst, and a light emitting unit LSU.

The first and second transistors T1 and T2 and the storage capacitor Cst are substantially the same as or similar to the first and second transistors T1 and T2 and the storage capacitor Cst described with reference to FIG. 5A, respectively, and thus overlapping descriptions will not be repeated.

The third transistor T3 may be connected between a $j^{th}$ sensing line SEN[j] and the second node N2, and may be connected to the second scan line SL2[i]. Herein, the second scan line SL2[i] may be the $j^{th}$ scan line SL[j] or a $(j+1)^{th}$ scan line SL[j+1], or although not illustrated in FIG. 1, may be a line to which a second scan signal outputted from a second scan driver that is distinct from the scan driver 300 is supplied.

The light emitting unit LSU may be connected between the second node N2 and the second power supply VSS.

The third transistor T3 may be turned on in response to the second scan signal of a gate-on voltage transmitted from the second scan line SL2[i] to electrically connect the sensing line SEN[j] and the second node N2. For example, when the third transistor T3 is turned on, a driving current flowing through the first transistor T1 (or a voltage of the second electrode of the first transistor T1) may be supplied to a sensing module inside the display device DD or a sensing device outside the display device DD through the sensing line SEN[j], and the sensing module may sense characteristics (e.g., a threshold voltage and mobility) of the first transistor T1 based on the driving current supplied through the sensing line SEN[j].

In one or more example embodiments, the transistors and the storage capacitor Cst, except for the light emitting unit LSU, in the subpixel SPX illustrated in FIG. 5A-FIG. 5C, may be referred to as a pixel circuit PXC, and the pixel circuit PXC may be located on a different layer from the light emitting unit LSU in the base substrate SUB1.

In FIG. 5A-FIG. 5C, at least one of the transistors illustrated as n-type transistors from among transistors included in the pixel circuit PXC may be changed to p-type transistors, and at least one of the transistors illustrated as the p-type transistors may be changed to an n-type transistor.

Figure 6:
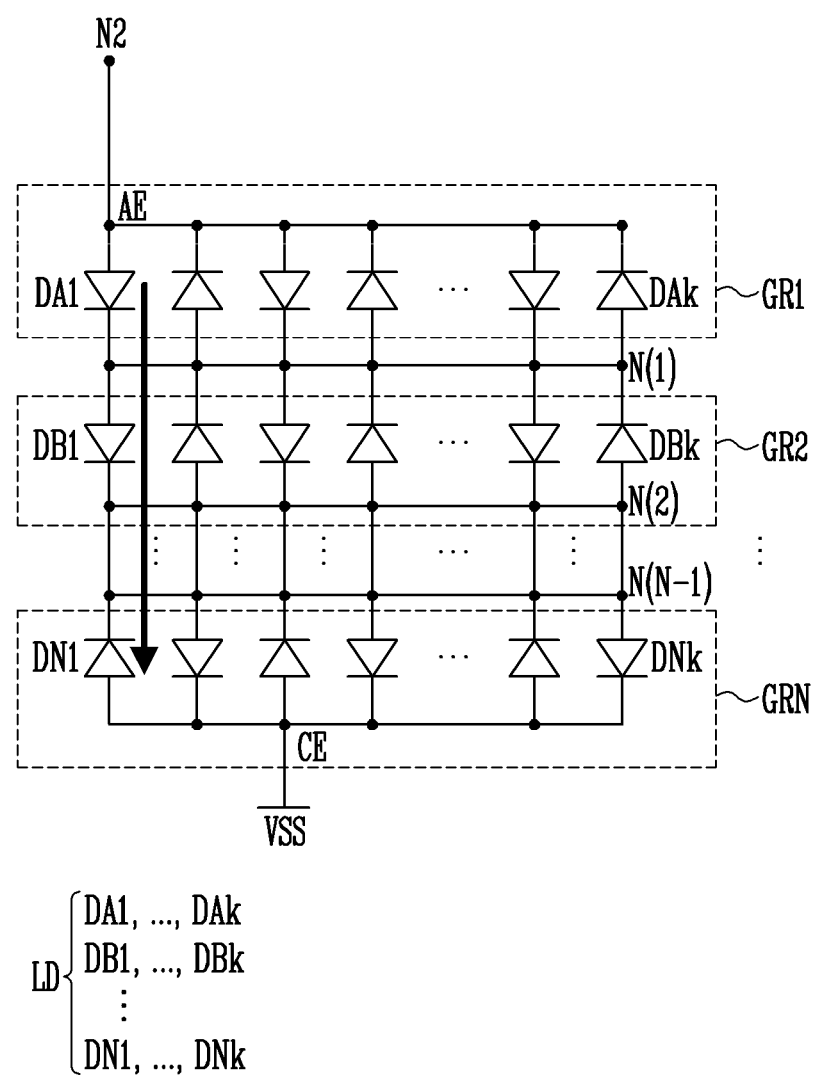
FIG. 6 illustrates a schematic view for describing a case where a dark spot occurs in a light emitting unit according to one or more example embodiments of the present disclosure.

FIG. 6 illustrates a schematic view for describing a case where a dark spot occurs in a light emitting unit according to one or more example embodiments of the present disclosure.

Referring to FIG. 6, a circuit showing the light emitting unit LSU connected between the second node N2 and the second power supply VSS in the subpixel SPX according to FIG. 5A-FIG. 5C is illustrated in detail.

The light emitting unit LSU may include a plurality of groups GR1, GR2, and GRN grouped by (or including) light emitting elements connected in parallel to each other. For example, the light emitting unit LSU may include a first group GR1 to an $N^{th}$ group GRN (N being a natural number of 1 or more) in each of which k light emitting elements are connected in parallel to each other (k being a natural number of 1 or more). In one or more example embodiments, the first group GR1 to the $N^{th}$ group GRN may be connected in series with each other between the first electrode AE of the light emitting unit LSU and the second electrode CE of the light emitting unit LSU.

In FIG. 5A-FIG. 5C, light emitting elements LD included in the light emitting unit LSU are illustrated to be connected in a direction in which current flows from the first power supply VDD to the second power supply VSS (hereinafter, referred to as a forward direction). However, some of the light emitting elements LD may be connected in a direction opposite to the forward direction (hereinafter, referred to as a reverse direction) due to errors in a process of aligning the light emitting elements LD in the forward direction.

For example, as illustrated in FIG. 6, some light emitting elements DA1, DB1, and DNk may be aligned in the forward direction, but some light emitting elements DN1, DAk, and DBk may be aligned in the reverse direction. In one or more example embodiments, the light emitting elements LD connected in the forward direction may be effective light supplies that emit light effectively, and the light emitting elements LD connected in the reverse direction may not emit light.

Further, some of the light emitting elements LD may be short-circuited to emit no light. For example, when at least one light emitting element is short-circuited in the first group GR1 of the light emitting elements connected in parallel to each other in FIG. 6, all of the light emitting elements DA1, . . . , and DAk belonging to the same first group GR1 as the short-circuited light emitting element may not emit light. In one or more example embodiments, when at least one light emitting element is short-circuited in the second group GR2 of the light emitting elements connected in parallel to each other, all of the light emitting elements DB1, . . . , and DBk belonging to the same second group GR2 as the short-circuited light emitting element may not emit light.

Accordingly, when at least one light emitting element LD is short-circuited in each of the groups GR1, GR2, . . . , and GRN, all of the light emitting elements LD included in the light emitting unit LSU may not emit light, and the subpixel SPX having such a light emitting unit LSU may be visually recognized as a dark spot from the outside.

However, even when a short circuit occurs between the light emitting elements LD to cause the light emitting unit LSU to emit no light, a constant current flows between the first power supply VDD and the second power supply VSS through the driving transistor T1 (as shown in FIGS. 5A-5C), and thus a power of the display device DD is unnecessarily consumed.

Figure 7:
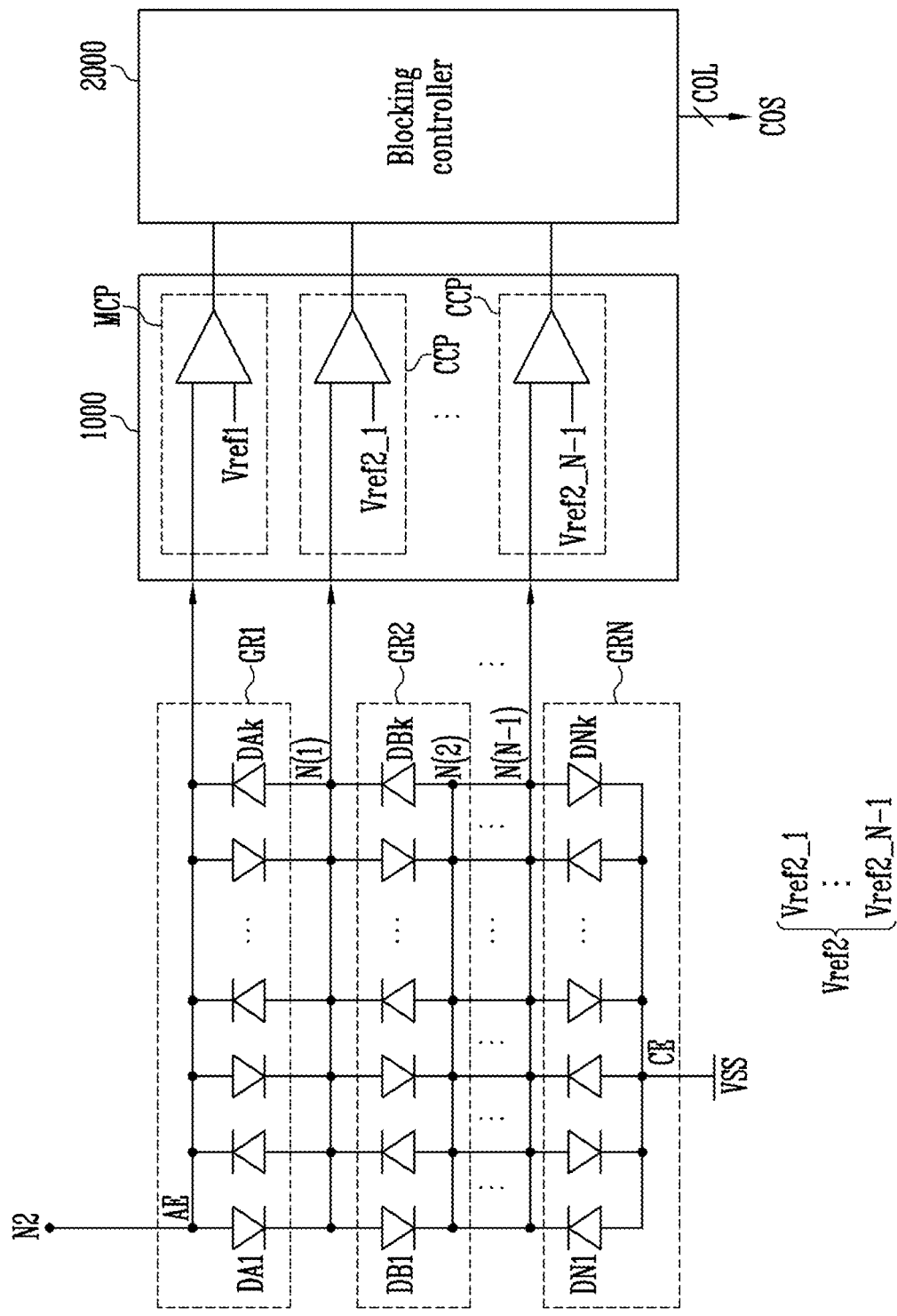
FIG. 7 illustrates a schematic diagram additionally showing a detector and a blocking controller according to one or more example embodiments of the present disclosure.

FIG. 7 illustrates a schematic diagram additionally showing a detector and a blocking controller according to one or more example embodiments of the present disclosure.

In one or more example embodiments, the display device DD may include a detector 1000 and a blocking controller 2000. The detector 1000 may be included in the display device DD (or in the pixel circuit PXC of the subpixel SPX) as many as the number of subpixels SPX included in the display device DD.

The detector 1000 may be electrically connected to the light emitting unit LSU to detect a short circuit in the light emitting elements LD. For example, the detector 1000 may include at least one comparator for comparing a reference voltage with a voltage of at least one of nodes N(1), N(2), . . . , and N(N−1) for connecting the first electrode AE and the groups GR1, GR2, . . . , and GRN in series.

The at least one comparator may include a main comparator MCP that is electrically connected to the first electrode AE to compare the voltage of the first electrode AE with a first reference voltage Vref1.

The main comparator MCP may include an amplifier AMP having a first input terminal to receive the voltage of the first electrode AE, a second input terminal to receive the first reference voltage Vref1, and an output terminal to output the result of the comparison of the voltage of the first electrode AE with the first reference voltage Vref1 performed at the amplifier. For example, the output terminal of the amplifier of the main comparator MCP may output one of a low level signal and a high level signal. For example, the main comparator MCP may output a signal of a high level signal when the voltage of the first electrode AE is greater than the first reference voltage Vref1, and may output a signal of a low level signal when the voltage of the first electrode AE is less than the first reference voltage Vref1.

The first reference voltage Vref1 may be determined as a value corresponding to the number of groups GR1, GR2, . . . , and GRN. For example, when the number of groups GR1, GR2, . . . , and GRN is N, the first reference voltage Vref1 may be determined by using Equation 1 below.

$$Vref1 = N \cdot VLD + V\_VSS \quad \text{(Equation 1)}$$

Referring to Equation 1, the first reference voltage Vref1 may be a value calculated by adding a voltage V_VSS of the second power supply VSS into a value obtained by multiplying the number N of the groups GR1, GR2, . . . , and GRN by a reference voltage VLD applied to one light emitting element LD.

When the voltage of the first electrode AE is less than the first reference voltage Vref1, it may be determined that at least one of the groups GR1, GR2, . . . , and GRN is short-circuited. Accordingly, the blocking controller 2000 may block the driving current when the voltage of the first electrode AE is less than the first reference voltage Vref1 based on an output of the main comparator MCP. For example, the blocking controller 2000 may block the driving current when the main comparator MCP outputs a signal of a low level.

In one or more example embodiments, the first reference voltage Vref1 may be determined by using Equation 2 below.

$$Vref1 = N \times VLD \times p + V\_VSS \quad \text{(Equation 2)}$$

Referring to Equation 2, the first reference voltage Vref1 may be a value calculated by adding the voltage V_VSS of the second power supply VSS into a value obtained by multiplying the number of the groups N by the reference voltage VLD applied to one light emitting element LD and a ratio p (e.g., a set ratio or a predetermined ratio p).

Unlike Equation 1, in Equation 2, by additionally multiplying the ratio p (e.g., a set ratio or a predetermined ratio p), the driving current may not be blocked when the number of short-circuited groups from among the groups GR1, GR2, . . . , and GRN is relatively small, and the driving current may be blocked when the number of short-circuited groups from among the groups GR1, GR2, . . . , and GRN is relatively large.

The at least one comparator may further include auxiliary comparators CCPs that are electrically connected to the respective nodes N(1), N(2), . . . , and N(N−1) connecting the groups GR1, GR2, . . . , and GRN in series with each other to compare voltages of the nodes N(1), N(2), . . . , and N(N−1) with a second reference voltage Vref2.

In one or more example embodiments, each of the auxiliary comparators CCPs may have a first input terminal to receive the voltage of one of the nodes N(1), N(2), . . . , and N(N−1), a second input terminal to receive the second reference voltage Vref2, and an output terminal to output the result of the comparison of the voltage received through the first input terminal with the second reference voltage Vref2 performed at the amplifier. For example, the output terminal of the amplifier of each of the auxiliary comparators CCPs may output either a low level signal or a high level signal. For example, the auxiliary comparators CCPs may output a signal of a high level when the voltage received through the first input terminal is greater than the second reference voltage Vref2, and may output a signal of a low level when the voltage received through the first input terminal is less than the second reference voltage Vref2.

The second reference voltage Vref2 may be determined according to nodes electrically connected to the first input terminals of the auxiliary comparators CCP. For example, when the auxiliary comparator CCP is connected to the first node N(1) that connects the first group GR1 and the second group GR2 in series, a second reference voltage Vref2_1 received to the auxiliary comparator CCP may be determined by using Equation 3 below.

$$Vref2\_1-VLD=(N-1)\times VLD+V\_VSS \qquad \text{(Equation 3)}$$

Referring to Equation 3, the second reference voltage Vref2_1 for the first node N(1) may be a value obtained by subtracting the reference voltage VLD applied to one light emitting element LD from the first reference voltage Vref1 according to Equation 1. On the assumption that the first reference voltage Vref1 is defined by Equation 1, the second reference voltage Vref2_1 for the first node N(1) may be expressed as a value obtained by adding a voltage V_VSS of the second power supply VSS into a value obtained by multiplying the reference voltage VLD applied to one light emitting element LD by N−1 times.

In one or more example embodiments, when the auxiliary comparator CCP is connected to the second node N(2) for connecting the second group GR2 and the third group in series, the second reference voltage Vref2 for the second node N(2) may be a value obtained by subtracting the reference voltage VLD applied to one light emitting element LD twice from the first reference voltage Vref1 according to Equation 1. On the assumption that the first reference voltage Vref1 is defined by Equation 1, the second reference voltage Vref2 for the second node N(2) may be a value obtained by adding a voltage V_VSS of the second power supply VSS into a value obtained by multiplying the reference voltage VLD applied to one light emitting element LD by N−2 times.

When the auxiliary comparator CCP is connected to the $(n-1)^{th}$ node n(n−1) for connecting the $(n-1)^{th}$ group and the $n^{th}$ group GRN in series, a second reference voltage Vref2_N−1 for the $(n-1)^{th}$ node n(n−1) may be a value obtained by subtracting the reference voltage VLD applied to one light emitting element LD from the first reference voltage Vref1 according to Equation 1 by N−1 times. On the assumption that the first reference voltage Vref1 is defined by Equation 1, the second reference voltage Vref2_N−1 for the $(n-1)^{th}$ node n(n−1) may be a value obtained by adding the reference voltage VLD applied to one light emitting element LD and the voltage V_VSS of the second power supply VSS.

When the detector 1000 includes the auxiliary comparators CCP as well as the main comparator MCP, the blocking controller 2000 may output a cutoff signal COS through a blocking control line COL based on outputs of the main comparator MCP and the auxiliary comparators CCP. For example, when at least one of the outputs of the main comparator MCP and the auxiliary comparators CCP is a signal of a low level, the blocking controller 2000 may output the cutoff signal COS through the blocking control line COL.

In one or more example embodiments, the blocking controller 2000 may include an OR operation circuit to output the cutoff signal COS by logically OR-operating the outputs of the main comparator MCP and the auxiliary comparators CCP. Herein, the OR operation circuit may be replaced with a NAND operation circuit that performs a logical NAND operation and outputs signal depending on an implementation method (e.g., depending on a type of blocking transistor CTR described later or an output level of the comparator).

Figure 8A:
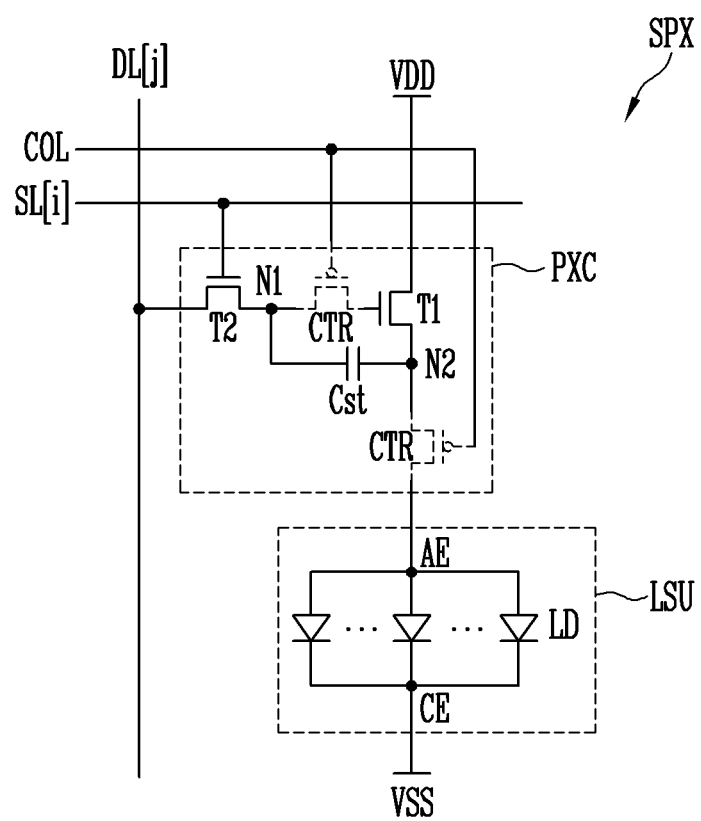
FIG. 8A-FIG. 8C illustrate circuit diagrams of a subpixel to which a blocking transistor to receive a cutoff signal according to FIG. 7 is added.
Figure 8B:
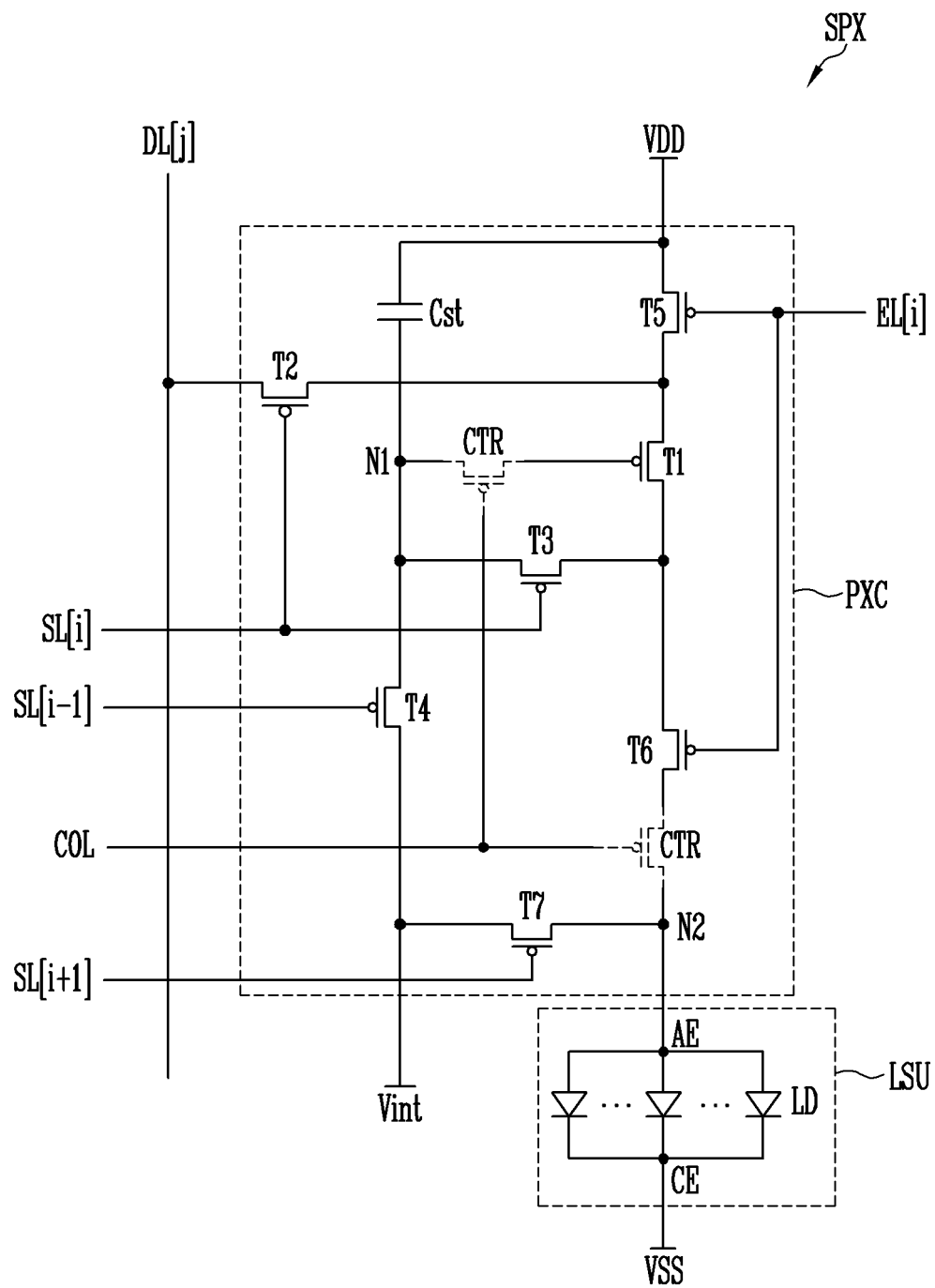
Figure 8C:
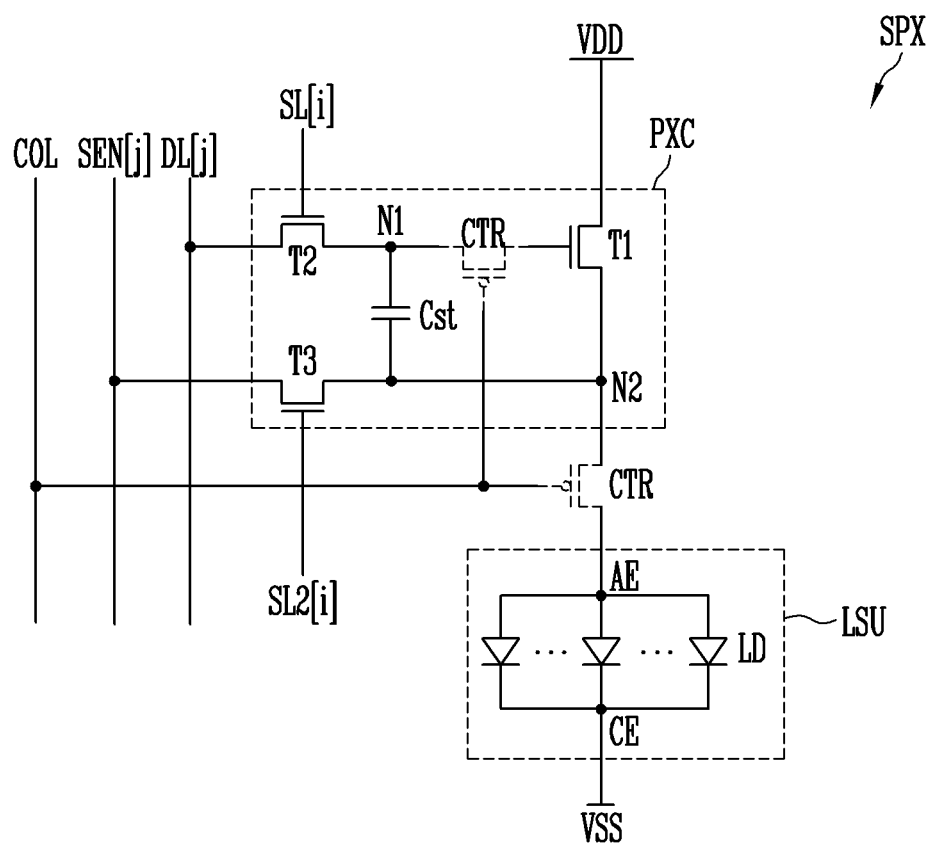

FIG. 8A-FIG. 8C illustrate circuit diagrams of a subpixel to which a blocking transistor to receive a cutoff signal according to FIG. 7 is added.

As described with reference to FIG. 7, when the cutoff signal COS is supplied through the blocking control line COL, the driving current of the subpixel SPX may be blocked. To this end, the subpixel SPX may further include a blocking transistor CTR that is turned off in response to the cutoff signal COS through the blocking control line COL.

Referring to FIG. 8A, a subpixel SPX in which the blocking transistor CTR is added to the subpixel SPX illustrated in FIG. 5A is illustrated. Referring to FIG. 8B, a subpixel SPX in which the blocking transistor CTR is added to the subpixel SPX illustrated in FIG. 5B is illustrated. Referring to FIG. 8C, a subpixel SPX in which the blocking transistor CTR is added to the subpixel SPX illustrated in FIG. 5C is illustrated.

The blocking transistor CTR may be electrically connected to the gate electrode of the driving transistor (e.g., first transistor T1) to turn off the driving transistor in response to the cutoff signal COS through the blocking control line COL. For example, referring to FIG. 8A-FIG. 8C, the blocking transistor CTR may include a gate electrode that is connected between the first node N1 and the gate electrode of the first transistor T1 and connected to the blocking control line COL. For example, the blocking transistor CTR may be connected between the first node N1 and the gate electrode of the first transistor T1 and the gate electrode of the blocking transistor CTR may be connected to the blocking control line COL. In some embodiments, when a cutoff signal COS of a high level is supplied through the blocking control line COL, the blocking transistor CTR may be turned off. Accordingly, a data signal of a gate-on level may not be transferred to the gate electrode of the first transistor T1 and the first transistor T1 may be turned off to cut off the driving current.

According to another example embodiment, the blocking transistor CTR may be connected on a path of a driving current flowing from the first power supply VDD to the second power supply VSS via the first transistor T1. For example, referring to FIG. 8A-FIG. 8C, the blocking transistor CTR may also include a gate electrode that is electrically connected between the second electrode (or second node N2) of the first transistor T1 and the first electrode AE of the light emitting unit LSU, and connected to the blocking control line COL. For example, the blocking transistor CTR may be electrically connected between the second electrode (or second node N2) of the first transistor T1 and the first electrode AE of the light emitting unit LSU, and a gate electrode of the blocking transistor CTR may be connected to the blocking control line COL. Also in some embodiments, when a cutoff signal COS of a high level is supplied through the blocking control line COL, the blocking transistor CTR may be turned off. Accordingly, because the path through which the driving current flows is blocked, the driving current may be blocked.

In FIG. 8A-FIG. 8C, on the assumption that the cutoff signal is a gate-on signal of a high level, the blocking transistor CTR is illustrated as a p-type transistor. However, when the cutoff signal COS is a gate-off signal of a low level, the blocking transistor CTR may be implemented as an n-type transistor. In one or more example embodiments, the blocking transistor CTR may be replaced with various types of switching elements that receive the cutoff signal COS to form an open circuit in response to the cutoff signal COS.

Figure 9:
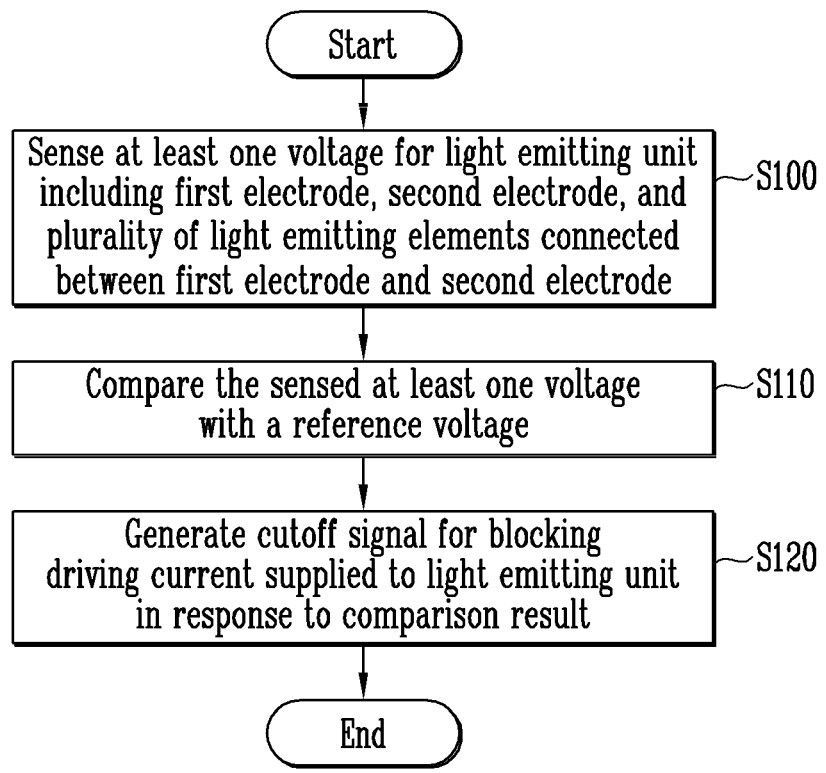
FIG. 9 illustrates a flowchart showing a driving method of a display device according to one or more example embodiments of the present disclosure.

FIG. 9 illustrates a flowchart showing a driving method of a display device according to one or more example embodiments of the present disclosure.

Referring to FIG. 9, a driving method of a display device may comprise: sensing at least one voltage for a light emitting unit comprising a first electrode, a second electrode, and a plurality of light emitting elements connected between the first electrode and the second electrode (S100); comparing the sensed at least one voltage with a reference voltage (S110); and generating a cutoff signal for blocking a driving current supplied to the light emitting unit in response to the comparison result (S120).

For example, referring to FIG. 9, a driving method of a display device may include: sensing at least one voltage of a light emitting unit having a first electrode, a second electrode, and a plurality of light emitting elements connected between the first electrode and the second electrode (S100); comparing the at least one sensed voltage with a reference voltage (S110); and generating a cutoff signal to block a driving current supplied to the light emitting unit in response to the comparison result (S120).

Each of the light emitting elements may be an inorganic light emitting diode having a nano-scale or micro-scale size.

The light emitting unit may include a plurality of groups, each group including a plurality of light emitting elements connected in parallel to each other, and the groups may be connected to each other in series between the first electrode and the second electrode.

The comparing step S110 may include comparing a voltage of the first electrode with a first reference voltage.

The comparing step S110 may further include comparing voltages of nodes connecting the groups in series with a second reference voltage.

In one or more example embodiments, the above-described driving method of the display device may include the operation of the display device DD described with reference to FIG. 1-FIG. 8C, and additional description will be omitted to prevent a duplicate description.

While example embodiments of the present disclosure have been particularly shown and described with reference to the accompanying drawings, the specific terms used herein are only for the purpose of describing the disclosure and are not intended to define the meanings thereof or be limiting of the scope of the disclosure set forth in the claims. Therefore, those skilled in the art will understand that various modifications and other equivalent embodiments of the present disclosure are possible. Consequently, the true technical protective scope of the present disclosure should be determined based on the technical spirit of the appended claims.

What is claimed is:

1. A display device comprising:
a subpixel comprising:
a light emitting unit comprising a first electrode, a second electrode, and a plurality of light emitting elements connected between the first electrode and the second electrode, and
a driving transistor configured to supply a driving current to the light emitting unit;
a detector electrically connected to the light emitting unit to detect a short circuit in the plurality of light emitting elements; and
a blocking controller configured to control blocking of the driving current based on an output of the detector, wherein the plurality of light emitting elements are organized into a plurality of groups, each of the plurality of groups comprising respective ones of the plurality of light emitting elements connected in parallel to each other, and the plurality of groups are connected to each other in series between the first electrode and the second electrode, wherein the detector comprises at least one comparator configured to compare a reference voltage with a voltage for at least one of nodes for connecting the first electrode and the plurality of groups in series, wherein the blocking controller is configured to control the blocking of the driving current based on a result of the comparison of the reference voltage with the voltage for the at least one of the nodes for connecting the first electrode and the plurality of groups in series from the detector, wherein the at least one comparator comprises a main comparator electrically connected to the first electrode to compare a voltage of the first electrode with a first reference voltage, and wherein the first reference voltage is determined by multiplying a number of the groups by a set ratio.

2. The display device of claim 1, wherein each of the plurality of light emitting elements comprises an inorganic light emitting diode having a nano-scale or micro-scale size.

3. The display device of claim 1, wherein the main comparator comprises an amplifier having a first input terminal to receive the voltage of the first electrode, a second input terminal to receive the first reference voltage, and an output terminal to output a result of a comparison of the voltage of the first electrode with the first reference voltage as one of a low level signal and a high level signal.

4. The display device of claim 1, wherein the blocking controller is to output a cutoff signal to block the driving current through a blocking control line when the voltage of the first electrode is less than the first reference voltage based on an output of the main comparator.

5. The display device of claim 4, wherein the subpixel further comprises a blocking transistor that is configured to turn off in response to the cutoff signal.

6. The display device of claim 5, wherein the blocking transistor is electrically connected to a gate electrode of the driving transistor to turn off the driving transistor in response to the cutoff signal.

7. The display device of claim 5, wherein the blocking transistor is connected to a path of the driving current flowing from a first power supply to a second power supply via the driving transistor.

8. The display device of claim 1, wherein the at least one comparator further comprises auxiliary comparators that are electrically connected to respective nodes to compare voltages of the respective nodes with a second reference voltage.

9. The display device of claim 8, wherein
the blocking controller outputs a cutoff signal to block the driving current through a blocking control line based on outputs of the main comparator and the auxiliary comparators.

10. The display device of claim 9, wherein the blocking controller is configured to output the cutoff signal by logically OR-operating the outputs of the main comparator and the auxiliary comparators.

11. A display device comprising:

a subpixel comprising:
- a light emitting unit comprising a first electrode, a second electrode, and a plurality of light emitting elements connected between the first electrode and the second electrode, and
- a driving transistor configured to supply a driving current to the light emitting unit;
- a detector electrically connected to the light emitting unit to detect a short circuit in the plurality of light emitting elements; and
- a blocking controller configured to control blocking of the driving current based on an output of the detector,
- wherein the plurality of light emitting elements are organized into a plurality of groups, each of the plurality of groups comprising respective ones of the plurality of light emitting elements connected in parallel to each other, and the plurality of groups are connected to each other in series between the first electrode and the second electrode,
- wherein the detector comprises at least one comparator configured to compare a reference voltage with a voltage for at least one of nodes for connecting the first electrode and the plurality of groups in series,
- wherein the at least one comparator comprises a main comparator electrically connected to the first electrode to compare a voltage of the first electrode with a first reference voltage, and
- wherein the first reference voltage is determined by using a value corresponding to a number of the plurality of groups.

12. A driving method of a display device, comprising:

sensing at least one voltage of a light emitting unit comprising a first electrode, a second electrode, and a plurality of light emitting elements connected between the first electrode and the second electrode;

comparing at least one sensed voltage with a reference voltage; and generating a cutoff signal to block a driving current supplied to the light emitting unit in response to a result of the comparison,
- wherein the plurality of light emitting elements are organized into a plurality of groups, each of the plurality of groups comprising respective ones of the plurality of light emitting elements connected in parallel to each other, and the plurality of groups are connected to each other in series between the first electrode and the second electrode,
- wherein the comparing the at least one sensed voltage with the reference voltage comprises comparing the reference voltage with a voltage for at least one of nodes for connecting the first electrode and the plurality of groups in series,
- wherein the cutoff signal to block the driving current supplied to the light emitting unit is generated in response to the result of the comparison of the reference voltage with the voltage for the at least one of the nodes for connecting the first electrode and the plurality of groups in series,
- wherein the comparing further comprises comparing a voltage of the first electrode with a first reference voltage and comparing voltages of nodes connecting the groups in series with a second reference voltage.

13. The driving method of claim 12, wherein each of the plurality of light emitting elements is an inorganic light emitting diode having a nano-scale or micro-scale size.

\* \* \* \* \*